United States Patent [19]

Lundquist

[11] Patent Number: 5,034,729
[45] Date of Patent: Jul. 23, 1991

[54] VIBRATION MONITOR FOR ROTATING OR MOVING EQUIPMENT

[76] Inventor: Lynn C. Lundquist, 10833 NE. Russell, Portland, Oreg. 97220

[21] Appl. No.: 510,511

[22] Filed: Apr. 18, 1990

[51] Int. Cl.⁵ ............................................. G08B 21/00
[52] U.S. Cl. .................... 340/683; 340/429; 340/566
[58] Field of Search .................. 340/683, 566, 429

[56] References Cited

U.S. PATENT DOCUMENTS

| | | | |
|---|---|---|---|
| 2,986,615 | 5/1961 | Hardway | 200/61.45 |
| 3,022,392 | 2/1962 | Clemson | 200/61.5 |
| 3,035,450 | 5/1962 | Hardway | 73/492 |
| 3,307,394 | 3/1967 | Bilbrey | 73/71 |
| 3,448,228 | 6/1969 | Munroe | 200/61.45 |
| 3,641,290 | 2/1972 | Murphy et al. | 200/61.45 |
| 3,967,493 | 7/1976 | Murphy et al. | 73/71 |
| 4,418,337 | 11/1983 | Bader | 340/571 |
| 4,663,747 | 5/1987 | Hall | 367/178 |
| 4,665,393 | 5/1987 | Wilder et al. | 340/683 |
| 4,744,248 | 5/1988 | Stewart | 73/505 |
| 4,744,249 | 5/1988 | Stewart | 73/505 |
| 4,759,220 | 7/1988 | Burdess et al. | 73/505 |
| 4,864,288 | 9/1989 | Cross | 340/669 |

*Primary Examiner*—Glen R. Swann, III

[57] ABSTRACT

This invention pertains to a device which is attached on rotating or moving equipment for the purpose of monitoring unsafe levels of equipment vibration. The invention comprises a mechanical assembly which is adjustably sensitive to the vibration amplitude of its given application. The monitor is so designed that it does not include the electronic switching device as an integral part of the invention. Rather, commercially available switching devices (proximity switches) are used as the electronic switching component. In the preferred embodiment, the unit is sensitive to vibration in any plane. The vibration monitor is a signaling device; it can be used to sound an external alarm, engage safety equipment, or disengage or stop moving equipment. It was developed as an inexpensive, rugged, device which can be used in conjunction with general purpose proximity switches to give vibration monitoring capability to an existing proximity switch product line.

21 Claims, 4 Drawing Sheets

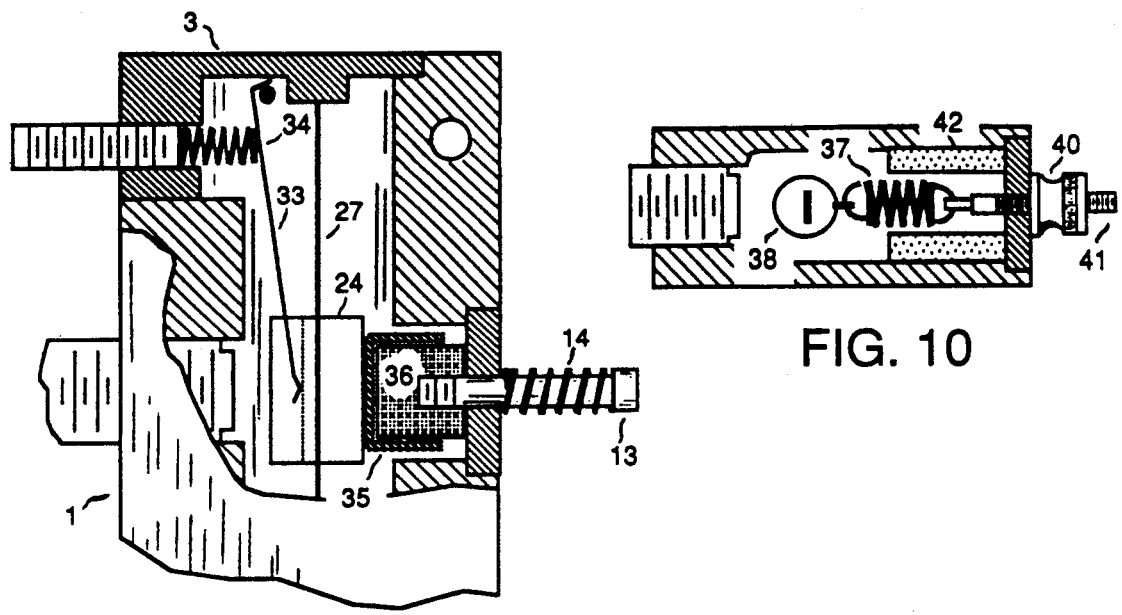
FIG. 8
FIG. 10
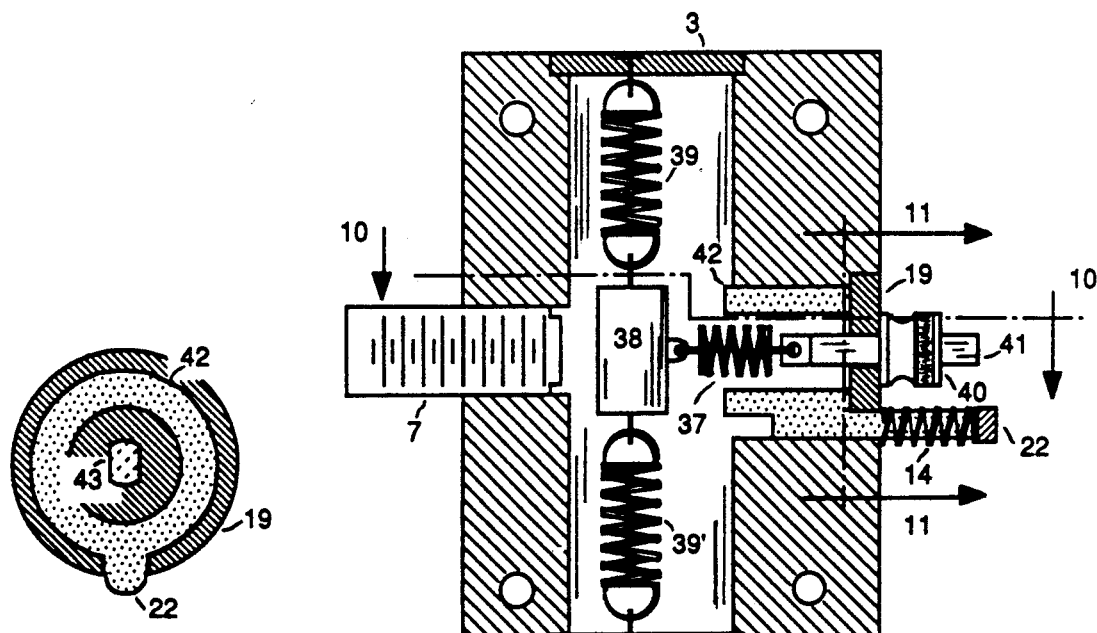
FIG. 11
FIG. 9

VIBRATION MONITOR FOR ROTATING OR MOVING EQUIPMENT

BACKGROUND—FIELD OF THE INVENTION

This invention provides a monitoring device which will initiate an alarm or provide an orderly shut-down of equipment in the presence of excessive vibration.

Moving equipment, most notably that which is powered by a rotating shaft, may be subjected to severe and dangerous vibrations in the event of unbalanced operation. An unbalanced condition may occur if the driven load becomes unequally distributed, or as a result of of a failure within the moving equipment itself.

In the normal course of operation, all equipment driven by a rotating shaft will have inherent vibration qualities. In general, the vibration frequency is a function of the rotational speed of a given shaft, whereas the amplitude is a function of the amount of imbalance. Equipment using rotating shafts will, therefore, have a design limit of tolerable vibration. However, if that limit is exceeded, some provision must be made to rectify the condition.

Monitoring vibration, therefore, has a twofold purpose: The first purpose is in providing safety for personnel operating the equipment. The second purpose is to minimize damage to the equipment by a timely shut-down of the machinery if excessive vibration occurs. It should therefore be obvious that an automatic means of disengaging the motor or prime mover (or of sounding an alarm) is generally preferable to a manual shut-down procedure performed by an operator.

BACKGROUND—DESCRIPTION OF THE PRIOR ART

In general, vibration monitoring equipment falls into two broad categories.

The first category of vibration monitoring equipment encompasses signaling devices which close (or open) electrical contacts at a given amplitude of vibration. Generally, these devices use a break-away inertial mass (or pendulum) which activates the electrical contacts at a pre-determined vibration condition. These vibration monitors are mechanical devices which use an inertial mass to activate an electrical contact when the mass is displaced by acceleration. Examples of this type of equipment are found in the U.S. patents by Hardway (U.S. Pat. Nos. 2,986,615 and 3,035,450), Clemson (U.S. Pat. No. 3,022,392), Bilbrey (U.S. Pat. No. 3,307,394), Munroe (U.S. Pat. No. 3,448,228), and Murphy (U.S. Pat. Nos. 3,641,290 and 3,967,493). In all cases, this type of monitoring equipment is responsive to vibration amplitude of relatively high displacement and velocity. They are also limited in their response to relatively low frequencies. (That is, frequencies of less than 3,000 cycles per second.)

Advantages of this first type of vibration monitoring equipment are realized in their lower cost (as compared with electronic equipment in the second category), ruggedness, simplicity and effectiveness as a shut-down device for rotating equipment. They are limited, however, in their inability to monitor high frequency or a wide range of vibration conditions. Furthermore, because they trip a mechanical switch, they must be physically reset before they can again provide protection.

The second category of vibration monitoring equipment is that of a two-stage system where a transducer is located on the vibrating equipment, while a receiving unit converts the transducer signal into a usable form. This equipment is entirely dependent on electronic apparatus. An example of a complete system in this category can be seen in the U.S. patent by Wilder et al (U.S. Pat. No. 4,665,393). Examples of transducers can be seen in the U.S. patents by Hall (U.S. Pat. No. 4,663,747), Steward (U.S. Pat. Nos. 4,744,248 and 4,744,249), and Burdess et al (U.S. Pat. No. 4,759,220).

This second type of vibration monitoring equipment is generally capable of greater sensitivity to varying vibration conditions and frequencies. It can be programmed to compensate for allowable start-up or shut-down conditions, and the like. It can also be used to record a vibration history for a given piece of equipment. Nonetheless, it has the disadvantages of complexity and high cost.

It can be shown that the prior art does not anticipate the advantages offered in my invention. Upon careful evaluation, it will be observed that each of the named patents most closely resembling my invention are substantially different. In all cases which must be considered; that is, Hardway (U.S. Pat. Nos. 2,986,615 and 3,035,450), Bilbrey (U.S. Pat. No. 3,307,394), Munroe (U.S. Pat. No. 3,448,228), and Murphy (U.S. Pat. Nos. 3,641,290 and 3,967,493), the internal mechanism and objective of their invention varies considerably. Notably, each of these inventions use an armature assembly which moves from a rest position to a trip position in the presence of a preset vibration amplitude. Whereas, the improvement I am suggesting mounts the inertial mass in the body of a resilient spring member. This improvement is significant inasmuch as each of the previously mentioned inventions must be manually or electrically reset before they can be placed back into service. In the case of the vibration monitor I am suggesting, the spring member which supports the inertial mass will always seek to reset while in the rest position. This improvement eliminates manual or remote electrical reset functions, and allows my invention to be used when a reset function is required in the presence of high vibration levels on start-up.

Murphy (U.S. Pat. No. 3,641,290, issued Feb. 8, 1972) further uses a weighted lever assembly forming a second moment of inertia arm so that an inertial force from any direction will cause the switch arm to move. Though there are similarities between my invention and this configuration, it must be noted that Murphy uses the device solely to move the lever arm, whereas my invention incorporates a fulcrum device integrally into the spring assembly, and further, that in my invention the device moves with the spring and enters into the sensing field of the proximity switch.

Further, in all cases where electrical control switching is involved, each of these inventions incorporate the switching means into the device as an integral part of their invention. Though there are certain advantages in doing so, it requires that the cost and complexity of the unit reflects specialized switching devices. In my improved design, the switch is not included as an integral part of the invention. Rather, my vibration monitor is designed so that readily available proximity switches can be used for the switching device, thus reducing the manufacturing costs of the vibration monitor and giving the unit greater flexibility in matching switching needs and complimenting a manufacturer's product line.

Typically, the units represented in these patents have a single plane of vibration sensitivity. Thus, in their mounting, they must be oriented to a specific plane of anticipated movement. In the preferred configuration which I am suggesting, however, I have provided a vibration monitor which has no required mounting orientation as the unit is sensitive to vibration movement in any plane.

It should also be noted that each of the above mentioned devices (with possibly the exception of Hardway (U.S. Pat. No. 2,986,615)) show a significantly greater complexity in their manufacture than the invention I am offering. Additionally, my invention requires less physical space for mounting than would be the case with most of these units, inasmuch as their physical size is greater because of the requirements of their inertial masses. Further, I am suggesting certain configurations which could be manufactured as preset vibration monitors for specific applications. The prior art does not lend itself to this type of reliable, yet inexpensive application.

Finally, I am incorporating a unique and useful testing means which is not available on any of the prior art. Though any of these other units could be tested with an external, parallel electrical contact, the advantage of the testing means I am suggesting is that it is performing the test through the circuitry and inertial mass displacement of the unit in exactly the way an actual emergency situation would trip the vibration monitor.

Thus, I am suggesting that the invention I am offering is both novel as compared with the prior art and will offer the end user significant utilitarian advantages.

OBJECTIVES OF THE INVENTION

This invention was developed with an understanding of the limitations of the previously described vibration monitoring equipment. Furthermore, it was developed for a specific application; that is, the protection of machinery incorporating rotating shafts and moving loads. This invention provides the switching functions of the first category of vibration monitors. However, it is so designed that it offers advantages over currently available units.

1. It is the general objective of this invention to provide a monitoring device which can be readily used to detect a predetermined vibration amplitude for the purpose of sounding an alarm or performing an orderly shut-down of moving equipment. This has been achieved with a moving inertial mass or pendulum which oscillates with the frequency and amplitude of the monitored equipment.

2. Another objective of the invention is to provide a means of varying the sensitivity of the vibration monitor in order to establish a safe operating threshold for any given piece of machinery. This may be done as a factory-set limit or as a field-adjustable function depending on the configuration selected. This has been achieved by the use of an externally adjustable threaded means so that the sensitivity of the unit can be readily set in service. Adjustment can be made under load for very precise settings. The threaded barrel of the proximity switch can further be used as an adjustment means.

3. Another objective of the invention is an inexpensive, rugged, and compact device which can be conveniently used on a wide range of moving equipment. This has been achieved by devising a design with few parts, non-critical tolerances, and readily molded or machined from common engineering plastics and metal fittings.

4. Another objective of the invention is to design the vibration monitor so that it incorporates an existing switching device into its design in order to avoid additional cost and complexity. This is achieved by using readily available proximity switches as the current switching unit. Thus, the design encourages its incorporation into a product line with an existing availability of proximity switches.

5. Another objective of the invention is to provide a means of testing the vibration monitor and associated circuitry without changing the operational settings. This is achieved by a test button arrangement which moves the pendulum into the sensing range of the proximity switch without altering the sensitivity adjustment.

6. Another objective of the invention is to provide a vibration monitor which does not require a manual (or electrical coil) resetting of the vibration monitor proper. This is achieved by a biased inertial mass or pendulum which will return to its normal operating position when the vibration oscillation dies down. Safety reset functions are often desirable, but they can more simply be achieved in the electrical control segment of the circuit than externally at the vibration monitor. The vibration monitor is also simplified by the elimination of a reset circuit.

7. Another objective of the invention is to provide a vibration monitor which is intrinsically safe. This is achieved by the use of a proximity switch. There are no open electrical contacts in the switch; it can be used in a damp or explosive atmosphere in accordance with the rating on the proximity switch.

8. Another objective of the invention is to provide a vibration monitor which operates on multiple planes of displacement. This has been achieved in the preferred configuration by the use of a fulcrum mounted inertial mass wherein catastrophic acceleration in any plane will move the pendulum into the sensing range of the proximity switch.

9. Another objective of the invention is to provide a vibration monitor which is small in physical size and weight. This has been achieved in all its configurations by the use of a design which includes simple and compact mechanical components working in conjunction with existing, compact proximity switches.

10. Another objective of the invention is to provide a vibration monitor unit which can accommodate a higher vibration amplitude at start-up and subsequently reset for normal running conditions at a lower amplitude. This has been achieved by the inherent resetting capability of the proximity switch vibration monitor. If the "on" function is delayed past the objectionable vibration amplitude, the unit will reset to provide greater sensitivity in the running mode. (In its simplest form, this would merely be the delay inherent in manipulating a manual "start" push button.)

11. A final objective of the invention is to provide a vibration monitor which can be used in low-amplitude applications. This has been achieved by opposing a low-friction mounted inertial mass in opposition to a non-contact proximity switch. Inasmuch as the inertial mass or pendulum need not exert any physical force against the sensing area of the proximity switch, in certain low-sensitivity configurations, the vibration monitor can be used to sense very low vibration amplitudes.

These and other objectives and advantages of the present invention, and the manner in which they are achieved, will become apparent in the following specifications and claims.

SUMMARY OF THE INVENTION

In its basic concept the present invention is a vibration sensing device used in conjunction with a proximity sensor to monitor the vibration amplitude of rotating or moving equipment. The device is so constructed that the periodic movement of a suspended mass, upon reaching a predetermined amplitude, will move into the sensing range of an internally mounted proximity sensor.

The vibration monitor is a refinement of presently used mechanical devices which close (or open) an electrical contact upon reaching a pre-set amplitude of vibration. An inertial mass or pendulum is mounted internally in the housing of the monitor so that it oscillates in a plane facing the sensing surface of the proximity sensor when the unit is mounted on a vibrating surface. At a predetermined vibration amplitude, the inertial mass or pendulum will move into the sensing range of the proximity switch, thus initiating the alarm or shut-down sequence of events determined by the electrical circuit.

Though the proximity switch and the related circuitry are not a subject of this patent, noting their function is worthwhile. An inductive proximity switch with a 10 mm threaded barrel is typically used. Generally, the configuration would be as a normally closed (NC) switch. (A normally open (NO) switch with appropriate circuitry may also be used.) At a given amplitude of vibration, the inertial mass or pendulum will enter the sensing range of the proximity switch, at which point, the normally closed (NC) contacts would be momentarily opened. This signal would then be used to communicate with a programmable controller (PC) or a relay circuit. (Typically, a relay circuit would be dropped out when the proximity switch opened, thus changing the position of the NC and NO contacts on the relay. If a latching relay is used, the circuit would need to be electrically reset for continued operation.)

When the vibration oscillation ceases, the pendulum will again seek its neutral position which is outside the sensing range of the proximity switch. Thus the vibration monitor will automatically reset when the fault-condition passes. Depending on the particular configuration of the unit in question, the vibration monitor is provided with either a biasing spring or a combination biasing spring and magnet. This biasing force provides the resistance which the pendulum must overcome to activate the proximity switch. The biasing force is also the means of resetting the unit after a fault.

The vibration monitor has a wide sensitivity range. The biasing spring and/or magnet are field adjustable in the preferred embodiments so that the break-away force of the inertial mass or pendulum can be controlled. This, in turn, sets the sensitivity of the unit to any chosen vibration amplitude within its operating range. The vibration monitor may also be selectively modified for predetermined ranges of vibration amplitude by changing spring or elastomeric element tension or changing the inertial or pendulum mass.

The vibration monitor also includes a test function. Inasmuch as the unit responds when the inertial mass or pendulum is moved into the sensing range of the proximity switch, the mass may be displaced in the same motion by manipulating a test button. This allows the entire circuit to be tested without altering the operational setting of the vibration monitor.

BRIEF DESCRIPTION OF THE DRAWINGS

FIG. 8 is an elevation view with partial cut-away section of a flat spring vibration monitor showing a dampening bar and dampening spring sensitivity adjustment, and a non-adjusting biasing magnet with isolation material. The non-adjusting magnet is incorporated into the test button function.

FIG. 9 is an elevation section view of the coil spring vibration monitor showing the coil spring mounted pendulum, the coil biasing spring, and the sleeve test button.

FIG. 10 is a sectional plan view of the coil spring vibration monitor taken along line 10—10 of FIG. 9.

FIG. 11 is a right sectional view of the test button sleeve taken along line 11—11 of FIG. 9.

DESCRIPTION OF THE PREFERRED EMBODIMENTS

Figure 1:
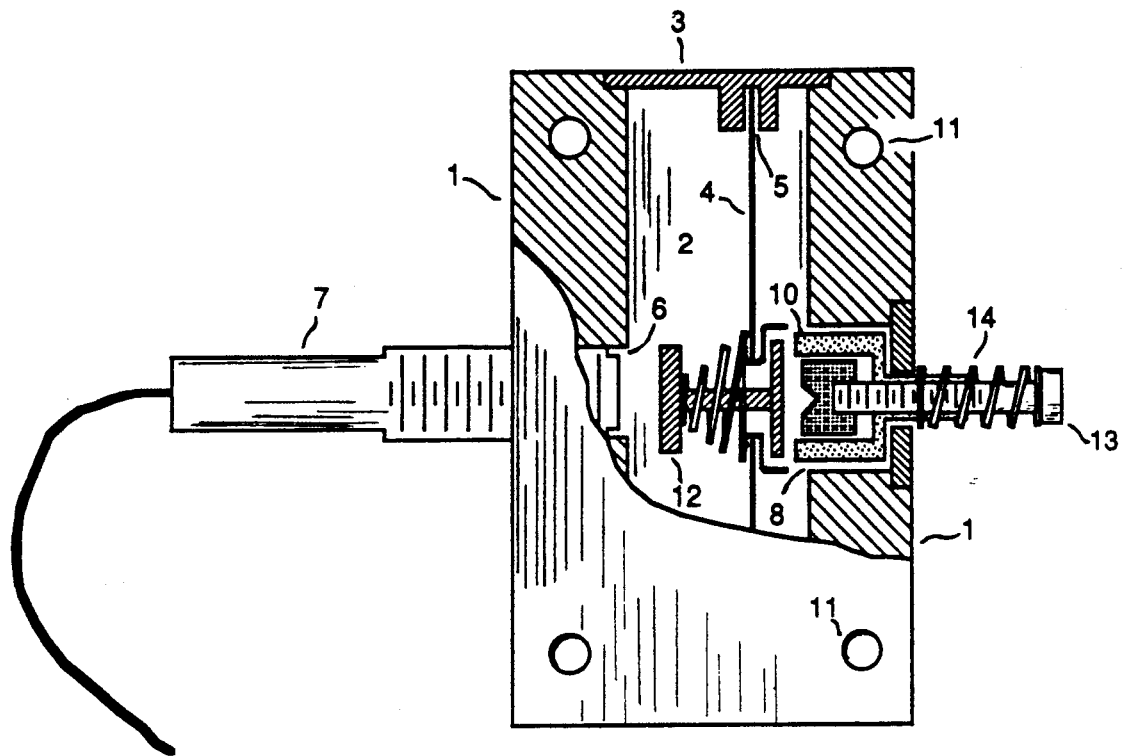
FIG. 1 is an elevation section view with partial cut-away section of the preferred embodiment of the vibration monitor showing a flat spring mounted fulcrum inertial mass, and an adjustable biasing magnet incorporated into the test button function.

To simplify the description, symmetrical parts, or portions of a single part where divided by a sectional view, will be designated with a prime ('). The description of the part(s) having primed reference characters will be limited to a minimum.

Referring now to FIG. 1, the details of the preferred embodiment of the vibration monitor are illustrated. A housing 1 of molded or machined plastic or other suitable material forms the body of the unit. The housing is open longitudinally through its center portion 2. The housing is enclosed by end caps 3 which also provide a mounting pocket 5 for the flat spring 4.

Figure 2:
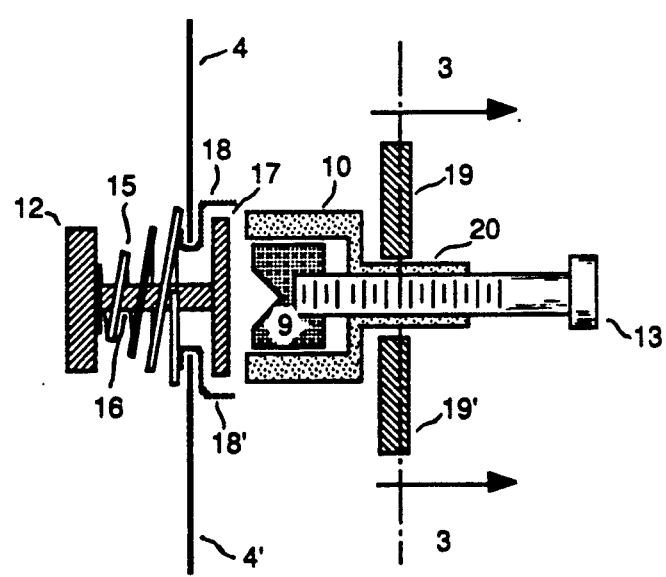
FIG. 2 is an enlarged elevation view of the flat spring mounted fulcrum inertial mass and the adjustable biasing magnet incorporated into the test button function.

The housing incorporates a threaded opening 6 for the proximity switch 7 which is perpendicular to the central opening 2. A second opening 8, opposite to the threaded opening 6, accommodates the biasing magnet 9 and magnet sleeve 10 which are shown in FIG. 2. The housing 1 will also include mounting holes 11 and other features required for normal mounting and operation.

The preferred embodiment of the vibration monitor shown in FIG. 1 also shows the location of the inertial mass assembly 12 and related parts as shown in FIG. 2.

FIG. 1 further shows the test button 13 and test button return spring 14 in their normal rest position.

FIG. 2 illustrates the inertial mass 12, adjustable biasing magnet 9, and test button 13 details. The inertial mass assembly is comprised of the inertial mass proper 12, the alignment spring 15, the connecting link 16, the fulcrum disc 17, and the fulcrum disc locating socket 18 which is mounted on the flat spring 4. The adjustable biasing magnet and test button assembly is shown which is comprised of the biasing magnet 9, the magnet sleeve 10 which is slidably mounted in the test button retainer 19, and the threaded test button shaft 13.

Figure 3:
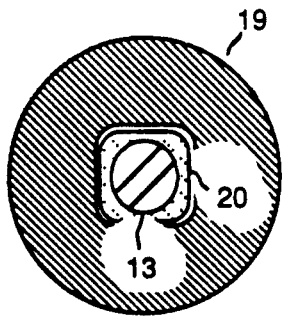
FIG. 3 is a right hand view of the test button retainer showing the detail which prevents rotation taken along line 3—3 of FIG. 2.

FIG. 3 illustrates the corresponding detail between the sleeve retainer 19 and the sliding portion 20 of the magnet sleeve 10 which prevents the sleeve from rotating while the test button 13 is manipulated in adjusting the biasing magnet 9.

Figure 4:
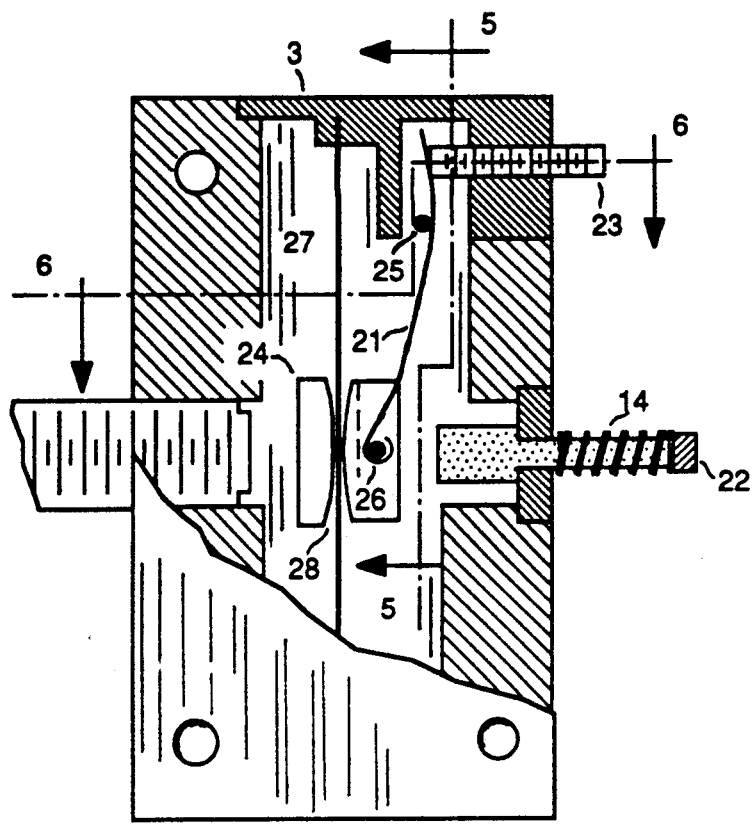
FIG. 4 is an elevation section view of the flat spring vibration monitor showing a flat spring mounted inertial mass, a wire spring and screw biasing assembly, and a non-magnetic test push button.

FIG. 4 illustrates a vibration monitor configuration which uses a wire biasing spring 21 and non-magnetic test button assembly 22. The biasing spring 21 is adjustably tensioned by an adjustment screw 23 which forces the solidly mounted inertial mass 24 against the test button 22 by means of a fulcrum pin 25. The wire biasing spring 21 is connected to the solidly mounted inertial mass 24 by means of a retainer pin 26. The inertial mass 24 has an arc face 28 at the point of fixation to the compound spring 27 in order to give greater freedom of movement.

Figure 5:
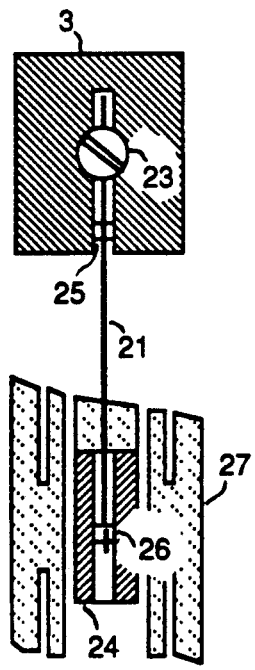
FIG. 5 is a partial right hand view of the compound flat spring and biasing spring adjustment taken along line 5—5 of FIG. 4.

FIG. 5 shows the portion of FIG. 4 along 5—5 illustrating the action of the adjustment screw 23 on the wire biasing spring 21, in which the fulcrum pin 25 is utilized to tension the solidly mounted inertial mass 24. The figure further shows a view of the solidly mounted inertial mass 24 as it is mounted to the compound flat spring 27 of FIG. 7.

Figure 6:
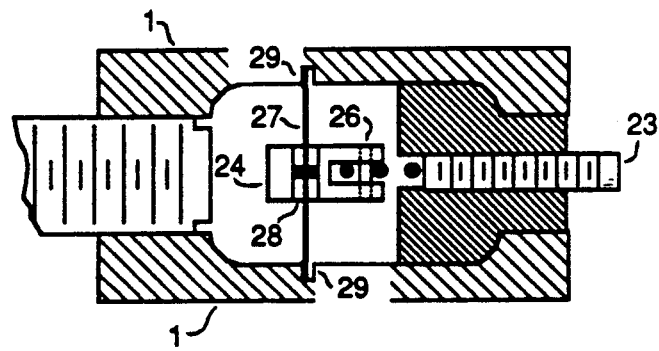
FIG. 6 is a plan sectional view of the compound flat spring vibration monitor taken along line 6—6 of FIG. 4.

FIG. 6 shows the portion of FIG. 4 along line 6—6 which demonstrates the wider configuration of the compound flat spring 27 and its mounted position in the housing 1 at 29.

Figure 7:
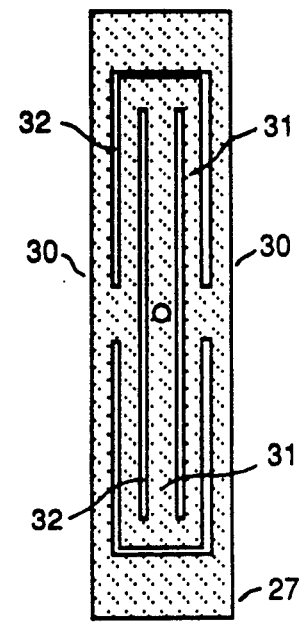
FIG. 7 is a right hand elevation view of the compound flat spring.

Referring to FIG. 7, it is evident that the border 30 of the compound flat spring 27 which is mounted in the slotted portion 29 of the housing body 1 does not flex at any point along its periphery. Rather, the suspended portions 31 of the spring flex as a result of the free play allowed in its open portions 32.

FIG. 8 illustrates a configuration which uses a biasing magnet 36 in combination with a test button 13 while at the same time providing a sensitivity adjustment in a separate feature. Sensitivity adjustment is accomplished by tensioning the dampening spring 34 with the adjusting screw 23 which varies the pressure on the compound flat spring 27 through the dampening bar 33. The biasing magnet 36 has a non-ferrous (preferably plastic) magnet shield 35 which reduces the break-away force required to separate the biasing magnet 36 and the ferrous inertial mass 24.

FIG. 9 illustrates a coil spring configuration of the vibration monitor. In this model, the pendulum 38 is suspendably mounted in equilibrium between two opposing springs 39. A sensitivity adjusting and oscillation dampening means is provided in dampening spring 37. Tension on the dampening spring 37 is adjustable through the thumb screw 40 and the threaded adjusting rod 41. This model is also provided with a testing function which comprises a test button 22 which forces the sleeve 42 into the pendulum 38, thus moving it into the sensing range of the proximity switch 7.

FIG. 11 shows the design characteristics of the test button projection 22 on the molded plastic sleeve 42. The threaded adjusting rod 41 is shown as having flattened areas which prevent it from rotating during adjustment.

Figure 12:
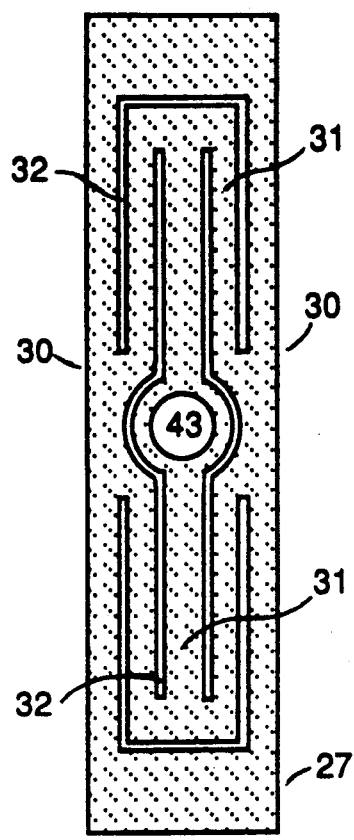
FIG. 12 is a right hand elevation view of the compound flat spring showing an alternate design for a larger inertial mass.

FIG. 12 shows the flat compound spring of FIG. 7 which is configured for an alternate inertial mass such as that shown in FIG. 2, in which case, the mounting area would require a larger opening and the contoured open portions 43 as indicated.

Figure 13:
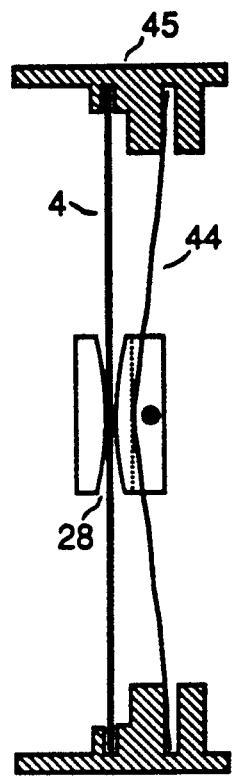
FIG. 13 is an elevation view of an alternate, fixed sensitivity flat spring arrangement.

FIG. 13 illustrates a fixed sensitivity inertial mass configuration in which a non-adjustable dampening spring 44 is mounted in a special end cap 45 with provision for locating both the flat spring 4 and the dampening spring 44. A radiused center mounting 28 provision is shown for the inertial mass 24 which provides greater freedom of movement for the flat spring 4.

Figure 14:
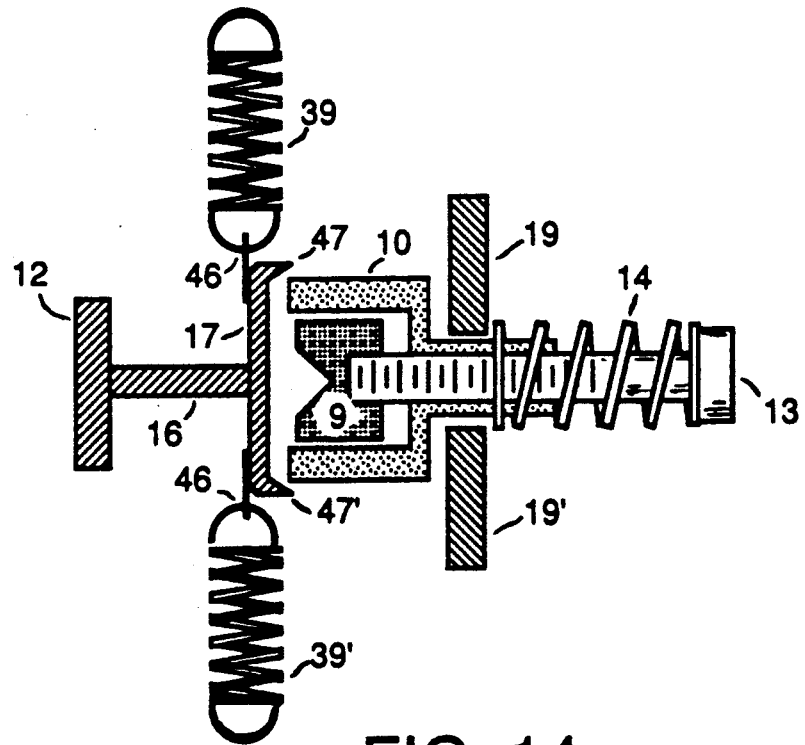
FIG. 14 is an elevation view of an alternate configuration showing a coil spring mounted fulcrum inertial mass, and an adjustable biasing magnet incorporated into the test button function.

FIG. 14 shows an inertial mass assembly (comprised of the inertial mass proper 12, the connecting link 16, and the fulcrum disc 17) suspandably mounted in equilibrium between two opposing springs 39. The springs are attached through mounting eyes 46 on the fulcrum disc 17. Alignment between the fulcrum disc 17 and the magnet sleeve 10 when the inertial mass assembly is in the rest position is assured by the locating lip 47 provided on the fulcrum disc 17.

OPERATION

In the preferred embodiment, illustrated in FIGS. 1, 2, and 3, the inertial mass assembly (comprising the inertial mass 12, the alignment spring 15, the connecting link 16, and the fulcrum disc 17) is moveably mounted on the flat spring 4 by means of a locating socket 18 which is integrally affixed to the flat spring 4. The inertial mass is so designed that motion in any plane will displace the inertial mass 12 toward the proximity switch 7 sensing surface. In any horizontal motion to which the unit is sensitive (that is, a motion which is moving the vibration monitor body from left-to-right when viewing FIG. 1) the inertial mass 12 is displaced toward the proximity switch 7. (It should be noted that any horizontal oscillatory motion will always produce a half-cycle in this displacement direction.) In either of the other two planes of motion (that is, a vertical plane of motion or a plane of motion toward or away from the viewer of FIG. 1) the inertial mass 12 will tend to displace in the opposite direction from the movement. In any of these cases, when the displacement force is sufficient for the fulcrum disc 17 to break-away from the attractive force of the biasing magnet 9, the inertial mass assembly will rotate about the axis formed by the point where the fulcrum disc 17 pivots on the magnet sleeve 10. The rotational motion will move the inertial mass 12 into the sensing range of the proximity switch 7. The flat spring 4 will flex allowing the displacement of the inertial mass assembly. Sufficient clearance is allowed between the opening of the fulcrum disc locating socket 18 and the inertial mass connecting link 16 to allow free rotational movement of the inertial mass 12.

The biasing magnet and test button assembly (which is comprised of the biasing magnet 9, the magnet sleeve 10, the threaded test button and shaft 13, the test button return spring 14, and the sleeve retainer 19) provide three independent functions. First, in the rest position, as a result of the attractive force of the biasing magnet 9, the face of the magnet sleeve 10 becomes the location stop for the fulcrum disc 17. The biasing magnet assembly (which is comprised of the biasing magnet 9, the magnet sleeve 10, the threaded test button and shaft 13) is held in the rest position by the test button return spring 14. Secondly, the assembly is the primary sensitivity adjustment for the vibration monitor. When the test button threaded shaft 13 is rotated against the internally threaded portion 20 of the magnet sleeve 10, the position of the biasing magnet 9 relative to the face of the magnet sleeve 10 is altered. (The magnet sleeve 10 is held non-rotatably rigid in the sleeve retainer 19 by the rectangular configuration of the threaded portion 20 of the magnet sleeve 10 which passes through the sleeve retainer 19.) The attractive force between the magnet 9 and the fulcrum disc 17 is decreased (and thus, the sensitivity of the vibration monitor is increased) as the magnet 9 is distanced from the fulcrum disc 17. Thirdly, the biasing magnet and test button assembly moves the inertial mass 12 into the sensitivity range of the proximity switch 7 by manually pressing the test button 13. Upon manual release of the test button 13, the test button return spring 14 will return the test button assembly to the rest position. It should be obvious that manipulation of the test button does not alter the sensitivity adjustment of the vibration monitor, while it allows for testing of the complete interrelated circuit.

A fulcrum disc locating socket 18 is affixed to the flat spring 4. This centers the fulcrum disc 17 of the inertial mass assembly so that it will continually operate in its assigned location relative to the biasing magnet 9 and magnet sleeve 10.

It should be apparent to the trained observer that in actual operation, the fulcrum disc 17 will always rest against the face of the magnet sleeve 18 when the biasing magnet 9 face is withdrawn into the magnet sleeve 18. In this position, the flat spring 4 will be slightly displaced toward the biasing magnet 9 assembly. (This observation will equally hold true for all other views which incorporate any of the biasing means.)

It should also be obvious that sensitivity parameters are determined by a number of variable factors which would include biasing magnet 9 strength and distance from the fulcrum disc 17, weight of the inertial mass 12 assembly, diameter of the fulcrum disc 17, and the relative tensions of the alignment spring 15 and the flat spring 4. Within the limits established by the above mentioned design considerations, the sensitivity is then adjustable by altering the biasing magnet 9 position relative to the fulcrum disc 17 with the threaded test button shaft 13, and/or by altering the position of the proximity switch 7 by means of the internal threads 6 in the housing body 1.

The end caps 3 are provided with a mounting pocket 5 for the flat spring 4. This mounting pocket is so designed with either a loose fit or a voluted wall, that the flat spring 4 has unrestricted movement at the furthest limits of its travel.

A compound spring 27 could advantageously be used with the vibration monitor illustrated in FIG. 1. Refer to FIG. 12 for the open portion 43 of the compound spring 27 which would accommodate the fulcrum disc locating socket 18 of this design.

Refer to FIG. 14 for a modification which uses the inertial mass assembly of the preferred embodiment (comprised of the inertial mass proper 12, the connecting link 16, and the fulcrum disc 17) suspendably mounted in equilibrium between two opposing springs 39. Operation of the biasing magnet and test button assembly (which is comprised of the biasing magnet 9, the magnet sleeve 10, the threaded test button and shaft 13, the test button return spring 14, and the sleeve retainer 19) are not altered. However, alignment between the fulcrum disc 17 and the magnet sleeve 10 when the inertial mass assembly is in the rest position is assured by the locating lip 47 provided on the fulcrum disc 17. Suspension points are provided on the fulcrum disc 17 at 46 which allow suspension of the inertial mass assembly.

Inasmuch as the function of the vibration monitor was thoroughly described as it pertains to FIGS. 1 through 3, only those differences which are unique to the remaining embodiments will be discussed at any length in the following section. It should be noted, that many design details and advantages of the preferred embodiment of the vibration monitor will be common to the following variants. It should also be noted that none of the unique design characteristics are to be construed as being limited to a single embodiment. A vibration monitor may include a combination of design features from various of the representative figures shown.

All of the following embodiments, however, are limited to a single plane of vibration response. That is, the inertial mass 24 or pendulum 38 will only move into the sensing range of the proximity switch 7 when the vibration monitor housing is displaced from right-to-left as depicted in FIGS. 4, 8, and 9. As such, each of the following embodiments would require unique mounting orientation for the desired plane of sensitivity. If the anticipated plane of vibration were to be a vertical (up-and-down) motion, the vibration monitor would be mounted so that the proximity switch 7 was in the down position. Mounted in this way, the weight of the inertial mass 24 or pendulum 38 would need to be further compensated for by the biasing means. Thus, the wire spring 21 of FIG. 4, the dampening bar 33 and dampening spring 34 of FIG. 8, or the dampening coil spring 37 of FIG. 9 must support the weight of the respective inertial mass 24 or pendulum 38 when the unit is used for a vertical plane of vibration.

FIGS. 4, 5, and 6 illustrate four variations from the preferred embodiment. First, the inertial mass 24 is integrally mounted to the compound spring 27. This design lends itself to a simpler construction which may be advantageous for specific-use vibration monitors where a pre-determined vibration amplitude is known. Secondly, the sensitivity adjusting means is a straight wire spring 21 which is tensioned by a the setting of the adjustment screw 23 in opposition to the fulcrum pin 25. (The figures show spring 21 as a wire spring. A flat spring could also be used.) Thirdly, the test button 22 has no biasing (magnetic) function. It may, or may not, serve as a stop for the inertial mass 24, but offers no resistance to movement of the mass when vibration is encountered. Fourthly, the inertial mass 24 is mounted to the compound flat spring 27 at 28 with a radiused center mounting which allows the inertial mass 24 to move with less restriction.

FIGS. 5 and 6 also suggest that the compound spring 27 requires a wider housing 1 than a flat spring 4 or the coil springs 39 of FIG. 9. However, the compound spring 27 has the advantage of much greater flexibility for its relative height. Thus, a unit with a compound spring 27 could be shorter, though wider, than a unit using a simple flat spring 4 or coil springs 39. This dimensional change would allow a more compact design for the vibration monitor.

FIG. 7 indicates the specific configuration of the compound spring 27 which allows greater flexibility for a given spring height. The compound spring is designed so that the effective length of the spring is much greater than the height of the spring. This is accomplished by the allowance of the working portions 31 of the spring to flex as a result of the free play allowed in its open portions 32.

FIG. 8 illustrates a variation of the vibration monitor in which a resilient dampening bar 33 is used to bias the inertial mas 24. In this arrangement, the adjusting screw 23 tensions an adjusting spring 34 which restrains the dampening bar 33. Another unique feature of this configuration is the magnet shield 35 which is solidly affixed to the biasing magnet 36. In this arrangement, the force between the biasing magnet 36 and the inertial mass 24 is determined in the manufacturing process by the material and thickness of the magnet shield 35. Thus, there is always a predetermined break-away force inherent in the design; the sensitivity adjustment is additive by increasing the biasing effect of the dampening bar 33.

A final configuration option is suggested in FIGS. 9 and 10. In this design, a pendulum 38 is suspendably mounted in equilibrium between two opposing springs 39. The effect of this arrangement is a pendulum 38 which is very sensitive to any vibration induced movement in its primary plane of movement. Unlike the designs which use magnetic attraction as a biasing means (in which case the inertial mass does not move until it breaks-away from the biasing magnet), the spring suspended pendulum will oscillate with any appreciable vibration. The advantage to this arrangement is that the unit may be constructed to react to smaller amplitudes of vibration over a longer period of time because of the effect of that vibration on an unrestrained mass. Adjustment is made possible, however, by the use of a dampening spring 37 and adjusting means in the thumb screw 40 and adjusting rod 41. In practice, the dampening spring 37 is of an appreciably lighter duty than are the support springs 39. The mass of the pendulum 38 and the force of the support springs 39 can be varied to accommodate varying vibration conditions.

The test button assembly consists of a one-piece unit which includes a movable sleeve 42 and an offset test button 22. As the test button 22 is pushed, the sleeve 42 is moved against the pendulum 38, forcing it into the sensing range of the proximity switch 7. As shown in FIG. 11, the threaded adjusting rod (detail 41 shown in FIG. 9) has a flat section on both sides 43 which prevents rotation when the thumb screw 40 is manipulated for sensitivity adjustment.

In some applications, a fixed-sensitivity unit may be made available. These units would have application where fieldsensitivity adjustment was not required. This may be the case where only catastrophic equipment protection is desired. Less expensive units could be made available with fixed spring tensions and/or magnet biasing arrangements. One such spring arrangement is shown in FIG. 13 where a secondary flat spring 44 is used to bias the main spring 4. FIG. 13 also illustrates the inertial mass with an arc face 28 and central mounting location.

While the present invention has been disclosed with respect to a preferred embodiment and modification thereto, further modifications will be apparent to those of ordinary skill in the art within the scope of the claims that follow. It is not intended that the invention be limited by the disclosure, but instead that its scope be determined by reference to the claims which follow herein below.

The embodiments of the invention in which an exclusive property or privilege is claimed are defined below.

What I claim is:

1. A vibration monitoring means comprising:
   (a) an inertial mass which is caused to move responsive to vibration; and
   (b) a proximity switch which is activated by an entrance of said inertial mass into a pre-determined sensing range of said proximity switch.

2. The vibration monitor of claim 1 further including a biasing means to fix the initial position and dampen the oscillation of said inertial mass wherein said biasing means is comprised of a permanent magnet adjustably located in a sleeve.

3. The vibration monitor of claim 1 further including a biasing means to fix the intial position and dampen the oscillation of said inertial mass wherein said biasing means is comprised of a permanent magnet with a magnet shield.

4. The vibration monitor of claim 1 further including a biasing means to fix the initial position and dampen the oscillation of said inertial mass wherein said biasing means is comprised of a wire spring adjustably bearing on the inertial mass through the means of a fulcrum pin.

5. The vibration monitor of claim 1 further including a biasing means to fix the initial position and dampen the oscillation of said inertial mass wherein said biasing means is comprised of a dampening bar adjustably bearing on the inertial mass through the means of a dampening spring.

6. The vibration monitor of claim 1 further including a biasing means to fix the initial position and dampen the oscillation of said inertial mass wherein said biasing means is comprised of a dampening coil spring adjustably retaining a pendulum.

7. The vibration monitor of claim 1 further including a biasing means to fix the initial position and dampen the oscillation of said inertial mass wherein said biasing means is comprised of a fixed sensitivity flat spring.

8. The vibration monitor of claim 1 further including a testing means to move the inertial mass into the sensing range of the proximity switch whereby the vibration monitor proper, and related circuits, may be verified comprising a slidable test button and magnet sleeve.

9. The vibration monitor of claim 1 further including a testing means to move the inertial mass into the sensing range of the proximity switch whereby the vibration monitor proper, and related circuits, may be verified comprising a non-magnetic test button.

10. The vibration monitor of claim 1 further including a testing means to move the inertial mass into the sensing range of the proximity switch whereby the vibration monitor proper, and related circuits, may be verified comprising a test button with an attached shielded and movable magnet.

11. The vibration monitor of claim 1 further including a testing means to move the inertial mass into the sensing range of the proximity switch whereby the vibration monitor proper, and related circuits, may be verified comprising a sleeve which moves over a fixed coil spring to move a pendulum.

12. The vibration monitor of claim 1 wherein a housing is incorporated which comprises:

(a) a longitudinally open portion within said housing;

(b) a threaded opening at right angles to said open portion for said proximity switch; and (c) an opening in opposition to said threaded opening portion for a biasing magnet or test button assembly.

13. The vibration monitor of claim 1 wherein said inertial mass comprises a rotatably mounted assembly centered in a locating socket affixed to a spring device so mounted that displacement in either a plane parallel to, or a plane perpendicular to, said spring device causes said assembly to enter the sensitivity range of said proximity switch of claim 1.

14. The vibration monitor of claim 1 wherein said inertial mass comprises an inertial mass rigidly mounted to a spring device so that displacement in a plane perpendicular to said spring device causes said assembly to enter the sensitivity range of the proximity switch of claim 1.

15. The spring device for the inertial mass of claim 13 or 14 wherein said spring device is configured as a flat spring.

16. The spring device for the inertial mass of claim 15 wherein a fixed fulcrum disc locating socket is integral with said spring member.

17. The spring device for the inertial mass of claim 13 or 14 wherein said spring device is configured as a compound flat spring.

18. The spring device for the inertial mass of claim 17 wherein a fixed fulcrum disk locating socket is integral with said spring member.

19. The vibration monitor of claim 1 wherein said inertial mass comprises a pendulum suspendably mounted to a multiplicity of spring devices so that displacement in a plane perpendicular to said spring devices causes said pendulum to enter the sensitivity range of the proximity switch of claim 1.

20. The vibration monitor of claim 1 wherein said inertial mass comprises a rotatably mounted assembly suspendably mounted between a multiplicity of spring devices so that displacement in either a plane parallel to, or a plane perpendicular to, said spring devices causes said assembly to enter the sensitivity range of the proximity switch of claim 1.

21. The spring device for the inertial mass of claim 19 or 20 wherein said spring device is configured as an opposing pair of coil springs.

* * * * *